United States Patent
Chen et al.

(10) Patent No.: US 10,791,620 B2
(45) Date of Patent: Sep. 29, 2020

(54) OPTICAL MODULE (71) Applicant: InnoLight Technology (Suzhou) LTD., Suzhou, Jiangsu (CN)

(72) Inventors: Long Chen, Jiangsu (CN); Yuzhou Sun, Jiangsu (CN); Dengqun Yu, Jiangsu (CN)

(73) Assignee: InnoLight Technology (Suzhou) Ltd., Suzhou (CN)

( * ) Notice: Subject to any disclaimer, the term of this patent is extended or adjusted under 35 U.S.C. 154(b) by 0 days.

(21) Appl. No.: 16/021,087

(22) Filed: Jun. 28, 2018

(65) Prior Publication Data

US 2019/0029102 A1 Jan. 24, 2019

(30) Foreign Application Priority Data

Jul. 19, 2017 (CN) .......................... 2017 1 0591780

(51) Int. Cl.
*H05K 1/02* (2006.01)
*G02B 6/42* (2006.01)

(52) U.S. Cl.
CPC ........... *H05K 1/021* (2013.01); *G02B 6/4273* (2013.01); *H05K 1/0216* (2013.01); *H05K 1/0274* (2013.01); *H05K 2201/10121* (2013.01)

(58) Field of Classification Search
CPC ......... H05K 1/021; H05K 2201/10121; G02B 6/0085; G02B 6/4269
See application file for complete search history.

(56) References Cited

U.S. PATENT DOCUMENTS

| 6,773,532 B2* | 8/2004 | Wolf .................... G02B 6/4277 |
| | | 156/182 |
| 9,496,959 B1 | 11/2016 | Nagarajan et al. |
| 9,641,254 B1* | 5/2017 | Shen ...................... H04B 10/40 |
| 10,018,794 B2 | 7/2018 | Sun et al. |
| 10,171,170 B2 | 1/2019 | Luo et al. |
| 2012/0103663 A1 | 5/2012 | Kobayashi et al. |
| 2016/0192533 A1 | 6/2016 | Fang et al. |
| 2016/0198586 A1* | 7/2016 | Bouda .................... H05K 1/148 |
| | | 361/716 |

FOREIGN PATENT DOCUMENTS

| CN | 102543913 A | 7/2012 |
| CN | 104465552 A | 3/2015 |
| CN | 104678515 A | 6/2015 |
| CN | 104730656 A | 6/2015 |
| CN | 105549163 A | 5/2016 |
| CN | 205232234 U | 5/2016 |

\* cited by examiner

*Primary Examiner* — Mukundbhai G Patel
(74) *Attorney, Agent, or Firm* — Finnegan, Henderson, Farabow, Garrett & Dunner, LLP (57) ABSTRACT

An optical module includes a housing, a heat sink apparatus arranged in and thermally connected to the housing, and a printed circuit board partially arranged on the heat sink apparatus. The optical module further includes a first optoelectronic chip and a second optoelectronic chip that are both arranged on the heat sink apparatus. The first optoelectronic chip and second optoelectronic chip are both electrically connected to the printed circuit board. The printed circuit board has a first surface, a second surface opposite to the first surface, and an opening that extends from the first surface to the second surface. The second optoelectronic chip is arranged at the opening. The second optoelectronic chip is arranged separately from the first optoelectronic chip.

18 Claims, 7 Drawing Sheets

OPTICAL MODULE

CROSS-REFERENCE TO RELATED APPLICATION

This application is based upon and claims priority to Chinese Patent Application 201710591780.5, filed on Jul. 19, 2017, the entire content of which is incorporated herein by reference.

FIELD OF THE DISCLOSURE

The present disclosure relates to the field of optical communication element manufacturing technology and, more particularly, to an optical module.

BACKGROUND

As a result of rapid development of 4G communications and constantly increasing demand for cloud computing, market demand for high-speed optical modules increases by the day. In response to market demand for high-bandwidth and high-speed data transmission, module design has increasingly turned toward miniaturization and high density. Although efforts are being made toward the miniaturization and lowered power consumption of highly integrated circuits, along with the development of high-speed and high-bandwidth module technology, high levels of heat generation and power consumption from the modules have become a problem that must be faced. If comparatively good heat dissipation cannot be ensured, then the performance of temperature-sensitive elements and devices that convert light to electricity or electricity to light in the optical module will be greatly compromised, even resulting in the module's inability to operate normally or loss of effectiveness. Therefore, a more effective heat-dissipation structure must be used to ensure stable operation of devices.

SUMMARY

The purpose of the present disclosure is to provide an optical module, which possesses a high heat-dissipation capability and reduces the impact of signal crosstalk between optoelectronic chips.

In order to achieve the purposes above, one embodiment of the present disclosure provides an optical module, which includes a housing, a heat sink apparatus arranged in and thermally connected to the housing, and a printed circuit board partially arranged in the heat sink apparatus. The optical module further includes a first optoelectronic chip and a second optoelectronic chip that are both arranged on the heat sink apparatus. The first optoelectronic chip and second optoelectronic chip are both electrically connected to the printed circuit board. The printed circuit board has a first surface, a second surface opposite to the first surface, and an opening that extends from the first surface to the second surface. The second optoelectronic chip is arranged at the opening. The second optoelectronic chip is configured separately from the first optoelectronic chip.

DETAILED DESCRIPTION

The text below provides detailed descriptions of the present disclosure through referencing specific embodiments as illustrated in the attached drawings. However, these embodiments do not limit the present disclosure; the scope of protection for the present disclosure covers changes made to the structure, method, or function by persons of ordinary skill in the art on the basis of these embodiments.

In order to facilitate presentation of the drawings in this application, certain sizes of structures or parts have been enlarged relative to other structures or parts; as such, they are only for the purpose of illustrating the basic structure of the subject matter of this application.

Additionally, terms in the text indicating relative spatial position, such as "upper," "above," "lower," "below," and so forth, are used for explanatory purposes in describing the relationship between a unit or feature with another unit or feature depicted in a drawing. Terms indicating relative spatial position may be meant to include positions other than those depicted in the drawings when a device is being used or operated. For example, if the device shown in a drawing is flipped over, a unit that is described as being located "below" or "under" another unit or feature will be located "above" the other unit or feature. Therefore, the exemplary term "below" may include positions both above and below. A device can be oriented in other ways (rotated 90 degrees or facing another direction); as such, spatially-related descriptive terms that appear in the text should be interpreted accordingly.

Further, it should be understood that although terms such as first and second can be used to describe various elements or structures in this text, the objects of such description shall not be limited by the aforementioned terms. The aforementioned terms are only used to differentiate the objects of the description from one another. For example, a first surface can be called a second surface; similarly, a second surface can also be called a first surface. This in no way departs from the scope of protection of this application.

Figure 1:
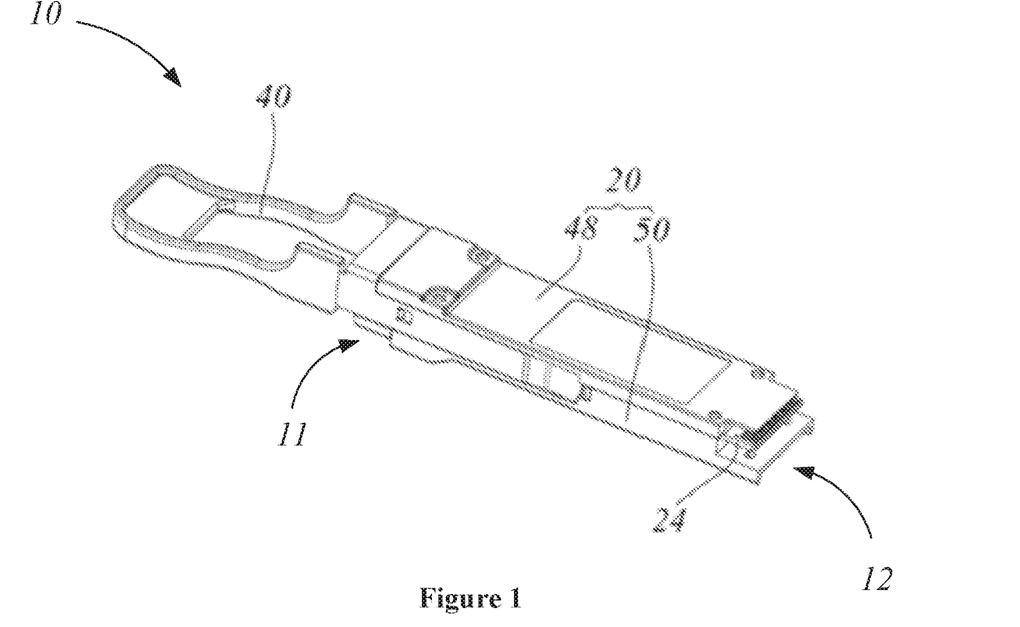
FIG. 1 is a three-dimensional diagram showing an optical module in a first embodiment of the present disclosure.
Figure 2:
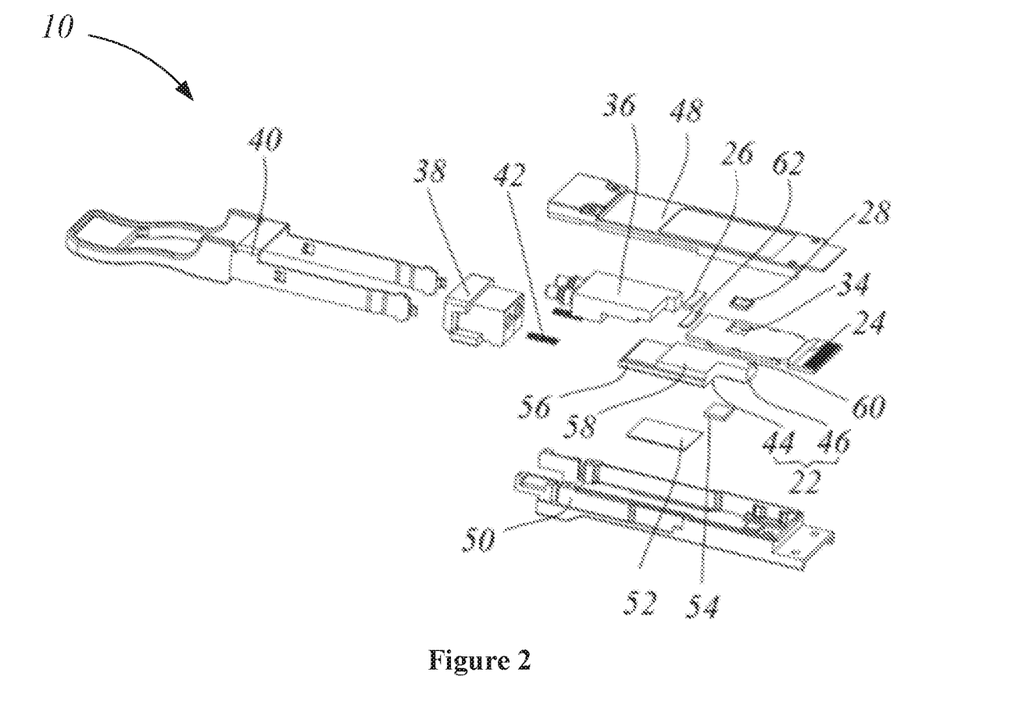
FIG. 2 is an exploded-view diagram showing an optical module in the first embodiment of the present disclosure.

FIGS. 1 through 6 schematically illustrate an optical module consistent with a first exemplary embodiment of the disclosure. FIG. 1 is a three-dimensional diagram showing an optical module 10 in the first embodiment. FIG. 2 is an exploded-view diagram of the optical module 10 in the first embodiment. Referring to FIGS. 1 and 2, the optical module 10 includes a housing 20, an optical interface system 36 arranged in the housing 20, a connector 38 fixed on the housing 20, and a pull ring 40 that is arranged on the housing 20 and used to unlock the optical module 10. A spring 42 is arranged between the connector 38 and the optical interface system 36. The optical module 10 also includes a heat sink apparatus 22 and a printed circuit board 24. Here, the heat sink apparatus 22 is arranged in the housing 20 and is thermally connected to the housing 20, and the printed circuit board 24 is partially arranged on the heat sink apparatus 22. In this example embodiment, the printed circuit board 24 is fixed to the housing 20 by snap-fitting, and the heat sink apparatus 22 is fixed to the housing 20 by an adhesive. The printed circuit board 24 may be arranged in the housing 20 by other connecting methods. Similarly, the heat sink apparatus 22 may be arranged in the housing 20 by other connecting methods as well.

The optical module 10 further includes a first optoelectronic chip 26 and a second optoelectronic chip 28 that are both arranged on the heat sink apparatus 22. The first optoelectronic chip 26 and the second optoelectronic chip 28 may both be optoelectronic chip arrays, or they may be single chips or a plurality of single chips arranged together. Here, the first optoelectronic chip 26 is a laser array, and the second optoelectronic chip 28 is a photoelectric detector array. The first optoelectronic chip 26 and the second optoelectronic chip 28 are electrically connected to the printed circuit board 24 by gold wire bonding or other means of high-speed signal electrical connection.

Figure 3:
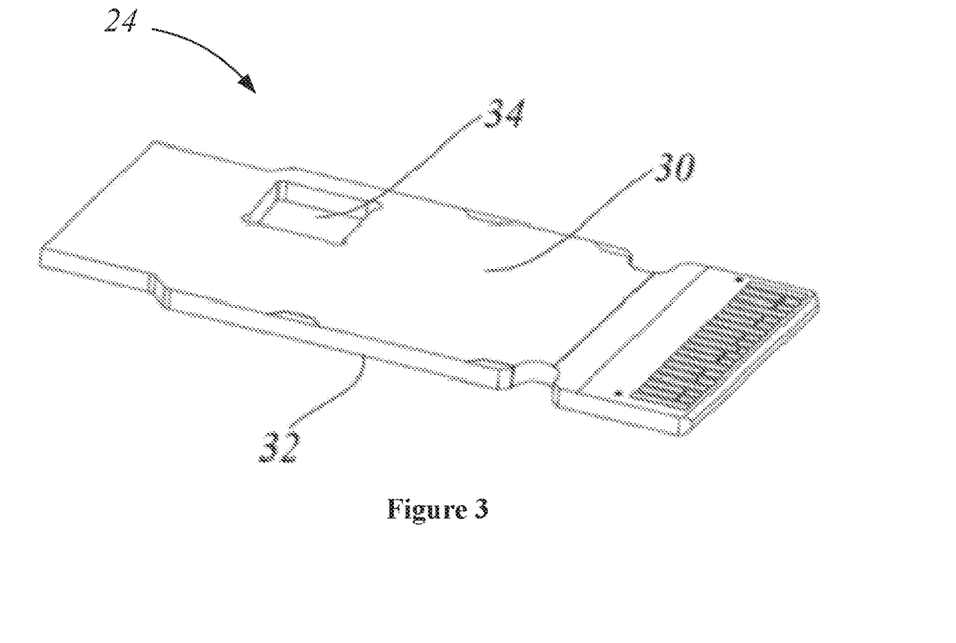
FIG. 3 is a three-dimensional diagram showing the printed circuit board of the optical module in FIG. 2.

FIG. 3 is a three-dimensional diagram of the printed circuit board 24 of the optical module 10 in FIG. 2. Referring to FIG. 3, the printed circuit board 24 has a first surface 30, a second surface 32 opposite to first surface 30, and an opening 34 that extends from the first surface 30 to the second surface 32. Here, the second optoelectronic chip 28 is arranged in the opening 34, and the second optoelectronic chip 28 is arranged separately from the first optoelectronic chip 26.

In this exemplary embodiment, the opening 34 is located in the printed circuit board 24, the second optoelectronic chip 28 is arranged in opening 34, and the first optoelectronic chip 26 and the second optoelectronic chip 28 are both arranged on the heat sink apparatus 22. Therefore, heat generated by the first optoelectronic chip 26 and the second optoelectronic chip 28 is dissipated to the housing 20 through the heat sink apparatus 22, resulting in a high heat-dissipation capability. Concurrently, the second optoelectronic chip 28 and the first optoelectronic chip 26 are arranged separately, thereby increasing the distance between the two optoelectronic chips, which greatly reduces the impact of signal crosstalk between the first optoelectronic chip 26 and the second optoelectronic chip 28 and improves the heat dissipation performance.

Figure 4:
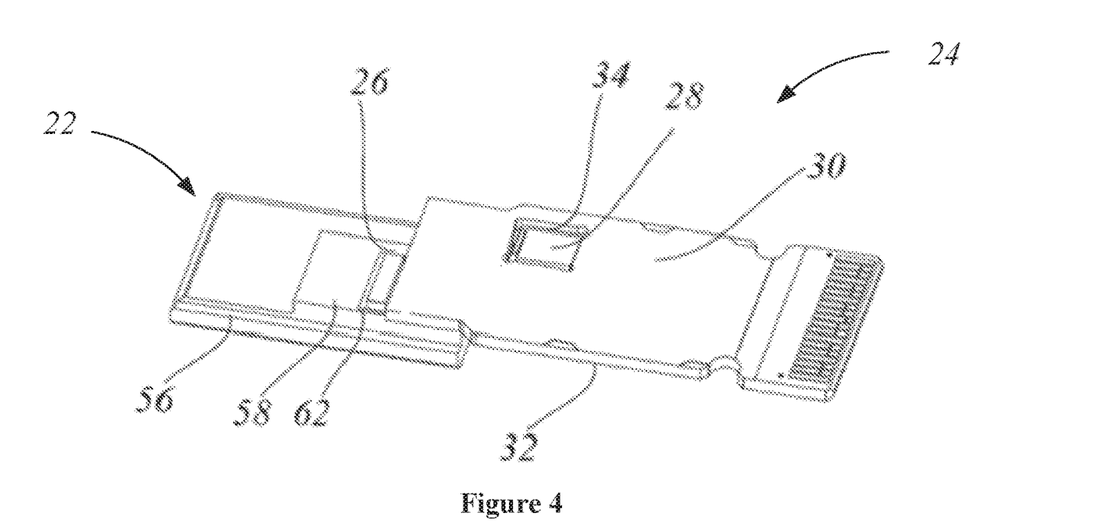
FIG. 4 is a three-dimensional diagram showing the printed circuit board, heat sink apparatus, and optoelectronic chip area of an optical module in the first embodiment of the present disclosure.
Figure 5:
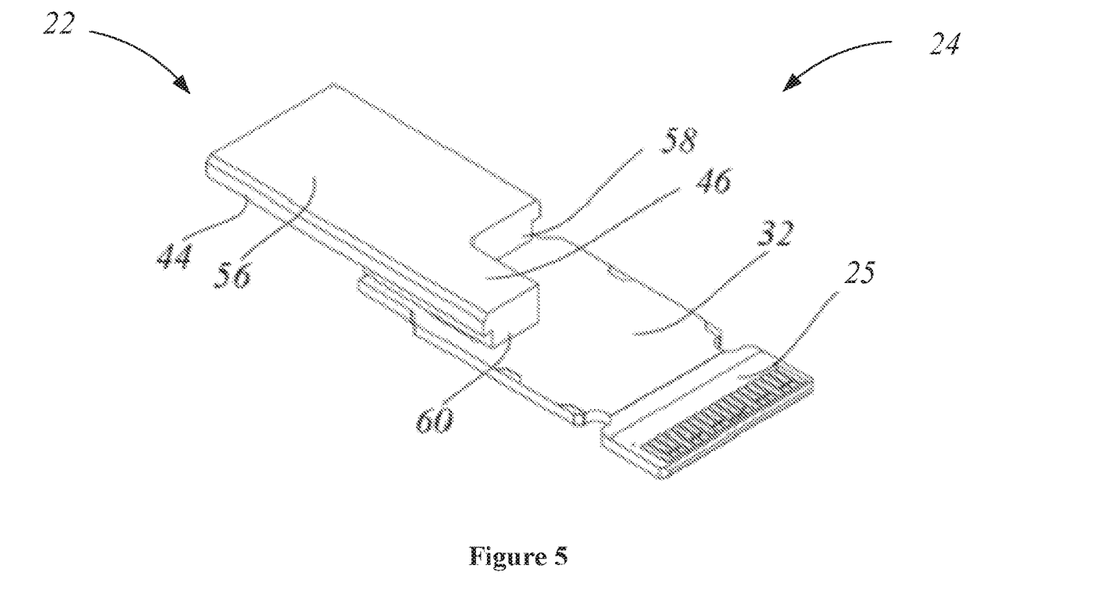
FIG. 5 is a three-dimensional diagram showing the optical module in FIG. 4 from a different perspective.
Figure 6:
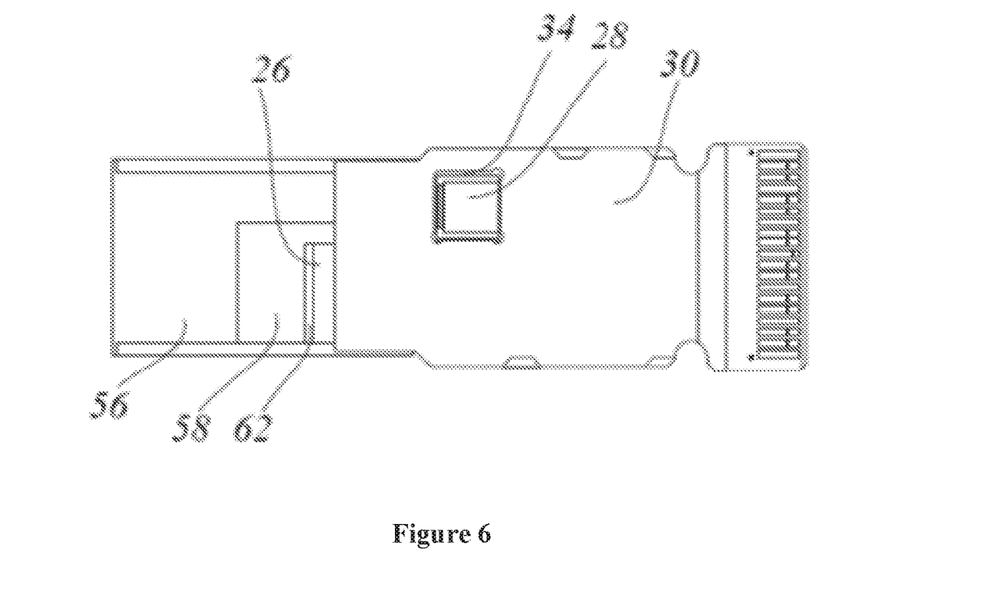
FIG. 6 is a front view of the optical module in FIG. 4.

FIG. 4 is a three-dimensional diagram of the printed circuit board 24, the heat sink apparatus 22, and an optoelectronic chip area of the optical module 10 consistent with the first embodiment of this disclosure. FIG. 5 is a three-dimensional diagram showing the optical module 10 in FIG. 4 from a different perspective. FIG. 6 is a front view of the optical module 10 in FIG. 4.

Referring to FIGS. 4, 5, and 6, the heat sink apparatus 22 includes a first heat sink 44 and a second heat sink 46 that is thermally connected to the first heat sink 44. The first optoelectronic chip 26 is arranged on the first heat sink 44, and heat generated by the first optoelectronic chip 26 is dissipated to the housing 20 through the first heat sink 44. The second heat sink 46 is partially located in the opening 34, and the second optoelectronic chip 28 is arranged on the second heat sink 46. Both the first heat sink 44 and the second heat sink 46 are thermally connected to the housing 20. In this way, heat generated by the first optoelectronic chip 26 and the second optoelectronic chip 28 is caused to dissipate to the housing 20 through the first heat sink 44 and the second heat sink 46, respectively, and the separate arrangement of the first optoelectronic chip 26 and the second optoelectronic chip 28 ensures that the optical module 10 has a comparatively high heat-dissipation capability while further reducing the impact of signal crosstalk between the first optoelectronic chip 26 and the second optoelectronic chip 28.

Referring to FIGS. 1 and 2, the housing 20 includes a first housing 48 and a second housing 50 that is connected to first housing 48. The first housing 48 and the second housing 50 may be fixed together with screws. The heat sink apparatus 22 is arranged near the second housing 50. Therefore, heat generated by the first optoelectronic chip 26 and the second optoelectronic chip 28 primarily transfers to the second housing 50, and the second housing 50 constitutes a primary heat-dissipation surface. Additionally, only a portion of the heat transfers to the first housing 48, and the first housing 48 constitutes a secondary heat-dissipation surface. The second housing 50 is specially designed for heat dissipation in order to better dissipate heat out of the housing 20.

In order to further increase the heat-dissipation capability of the optical module, a thermal pad or thermal grease is arranged between the heat sink apparatus 22 and the housing 20 so as to better conduct the heat from the heat sink apparatus 22 to the housing 20. In the first exemplary embodiment, the thermal pad or thermal grease is arranged between the heat sink apparatus 22 and the second housing 50. Specifically, a first thermal pad 52 is arranged between the first heat sink 44 and the second housing 50, and a second thermal pad 54 is arranged between the second heat sink 46 and the second housing 50. The first thermal pad 52 and the first optoelectronic chip 26 are arranged on two opposing sides of the first heat sink 44, and their positions correspond to each other. In other words, a projection of the first thermal pad 52 onto the first surface 30 of the printed circuit board 24 overlaps at least partially with the projection of the first optoelectronic chip 26 onto the first surface 30. The second thermal pad 54 and the second optoelectronic chip 28 are arranged on two opposing sides of the second heat sink 46, and their positions also correspond to each other. In other words, the projection of the second thermal pad 54 onto the first surface 30 of the printed circuit board 24 overlaps at least partially with the projection of the second optoelectronic chip 28 onto the first surface 30.

In the first exemplary embodiment, the first heat sink 44 and the second heat sink 46 form an integrated single structure. The first heat sink 44 and the second heat sink 46 may also employ separate structures that are thermally connected to each other or that are separately thermally connected to the housing 20. The heat sink apparatus 22 formed with the first heat sink 44 and the second heat sink 46 has an L-shape, and such structure can cause the positions of the first optoelectronic chip 26 and the second optoelectronic chip 28 to be staggered in a transmission direction of an optical path so that optical and electrical signals can be conveniently isolated. The L-shaped heat sink apparatus 22 can also, on the premise that it ensures heat dissipation, reduce usage of heat sinks and can also allow more layout space for the printed circuit board 24 to facilitate layout of elements.

The first heat sink 44 has a base 56 and a first protruding platform 58, and the first optoelectronic chip 26 is arranged on the first protruding platform 58. The first optoelectronic chip 26 is arranged near one end of the printed circuit board 24, and the first optoelectronic chip 26 is electrically connected to the printed circuit board 24. The second heat sink 46 has a second protruding platform 60, and at least a portion of the second protruding platform 60 is located in opening 34. The second optoelectronic chip 28 is located on the second protruding platform 60, and the second optoelectronic chip 28 is electrically connected to the printed circuit board 24. Additionally, an external electrical interface 25 for realizing external electrical connections is arranged at the end of the printed circuit board 24 that is farther from the first optoelectronic chip 26. In the first exemplary embodiment, the external electrical interface 25 includes gold fingers.

Additionally, the optical module 10 includes an optical interface 11 and an electrical interface 12, and the first optoelectronic chip 26 is located on the end of printed circuit board 24 nearest to the optical interface 11. Specifically, the positions of the first optoelectronic chip 26 and the second optoelectronic chip 28 are staggered along the direction of the line connecting the optical interface 11 and the electrical interface 12.

In the first exemplary embodiment, the first optoelectronic chip 26 is a laser emitter, and the second optoelectronic chip 28 is a photoelectric detector. The first optoelectronic chip 26 may also be configured to be a photoelectric detector and the second optoelectronic chip 28 as a laser emitter. Alternatively, the first optoelectronic chip 26 and the second optoelectronic chip 28 are both configured to be photoelectric detectors. Still alternatively, the first optoelectronic chip 26 and the second optoelectronic chip 28 are both configured to be laser emitters. When the first optoelectronic chip 26 and the second optoelectronic chip 28 are laser emitters or photoelectric detectors, there may also concurrently be drivers, optoelectronic signal detectors, or other elements. Here, the first optoelectronic chip 26 is a laser emitter, and the second optoelectronic chip 28 is a photoelectric detector. In this way, the laser emitter, as an element that generates a large amount of heat, is arranged near the middle portion of the heat sink apparatus 22 for better heat-dissipation performance. Additionally, the laser emitter is located on one side of the printed circuit board 24 rather than arranged in the middle portion of the printed circuit board 24, facilitating optical path design and assembly.

The cross section of the opening 34 in the direction parallel to the first surface 30 is a closed shape. In other words, the opening 34 is a through-hole whose periphery forms a closed shape. Preferably, the cross section of the opening 34 in the direction parallel to the first surface 30 is square. The cross section of the opening 34 in the direction parallel to the first surface 30 may also be configured to be other closed shapes.

Additionally, the cross section of the opening 34 in the direction parallel to the first surface 30 may also be configured to be an open shape. For example, the cross section of the opening 34 in the direction parallel to the first surface 30 may be configured to be U-shaped or L-shaped. The opening 34 may also be configured to be other open shapes.

In the first embodiment, the printed circuit board 24 is adhered on the heat sink apparatus 22. Other connecting methods may be used to fix the printed circuit board 24 on the heat sink apparatus 22. The printed circuit board 24 may be directly adhered on the heat sink apparatus 22. Alternatively, the printed circuit board 24 may be indirectly adhered on the heat sink apparatus 22, in which case a thermally or electrically conductive medium may be arranged between the printed circuit board 24 and the heat sink apparatus 22. In this example embodiment, the first optoelectronic chip 26 and the second optoelectronic chip 28 are located on the same side of the heat sink apparatus 22. In other words, the first optoelectronic chip 26 and the second optoelectronic chip 28 are arranged on a same-side surface of the heat sink apparatus, and the first optoelectronic chip 26 and the second optoelectronic chip 28 are electrically connected to the same surface of the printed circuit board 24. The first optoelectronic chip 26 and the second optoelectronic chip 28 may also be arranged on different sides of the heat sink apparatus 22, such as being arranged on opposite sides of the heat sink apparatus 22. When the first optoelectronic chip 26 and the second optoelectronic chip 28 are arranged on different sides of the heat sink apparatus 22, the first optoelectronic chip 26 is electrically connected to one of the surfaces of the printed circuit board 24, and the second optoelectronic chip 28 is electrically connected to the other surface of printed circuit board 24. In this way, signal transmission crosstalk is further reduced, and the quality of signal transmission is further increased. Specifically, when the first optoelectronic chip 26 and the second optoelectronic chip 28 are located on different sides of the heat sink apparatus, a hole or groove is arranged on the first heat sink 44 to allow light to pass through. An optical fiber may also be used to realize the connection of the optical path, etc.

Additionally, a first electrical isolation pad 62 is arranged between the first optoelectronic chip 26 and the heat sink apparatus 22. The first electrical isolation pad 62 is thermally connected to the heat sink apparatus 22 and has an electrical isolation effect, thereby enabling heat generated by the first optoelectronic chip 26 to transfer to the housing 20 through the heat sink apparatus 22 to realize heat dissipation while achieving electrical isolation between the housing 20, the heat sink apparatus 22, and the first optoelectronic chip 26. This stabilizes the performance of the optical module 10 and makes it safe to use. Here, an upper surface of the first electrical isolation pad 62 includes a material of low electrical conductivity and is electrically connected to the printed circuit board 24, and the substrate and a lower surface of the first electrical isolation pad 62 include an electrically non-conductive material for electrical isolation from the heat sink apparatus 22.

A second electrical isolation pad is arranged between the second optoelectronic chip 28 and the heat sink apparatus 22, and the second electrical isolation pad is thermally connected to and electrically isolated from the heat sink apparatus 22. Similarly, heat generated by the second optoelectronic chip 28 may transfer to the housing 20 through the heat sink apparatus 22 to realize heat dissipation while achieving electrical isolation between the housing 20, the heat sink apparatus 22, and the second optoelectronic chip 28. This further stabilizes the performance of the optical module and makes it safer to use.

In other exemplary embodiments, the heat sink apparatus 22 may itself be made of electrically isolating and highly thermally conductive materials so as to not require the use of electrical isolation pads.

Figure 7:
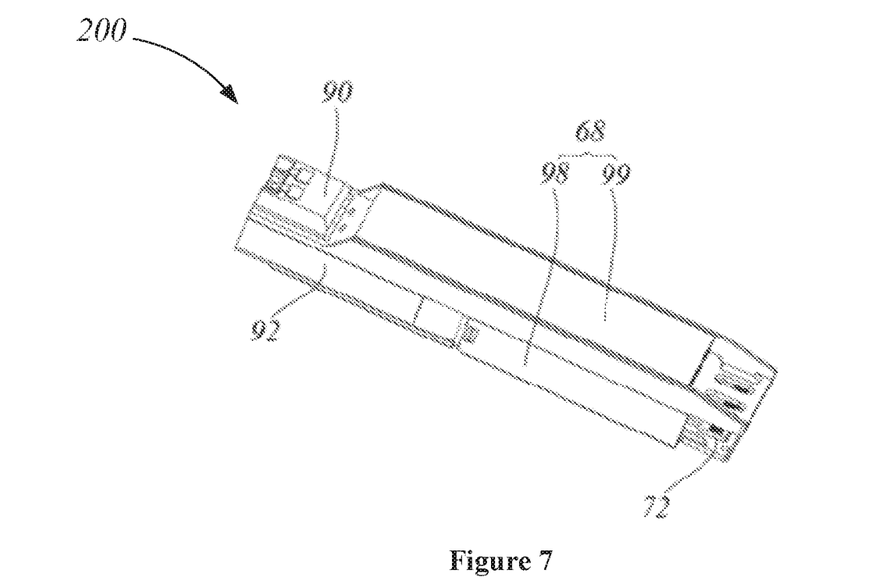
FIG. 7 is a three-dimensional diagram showing an optical module in the second embodiment of the present disclosure.
Figure 8:
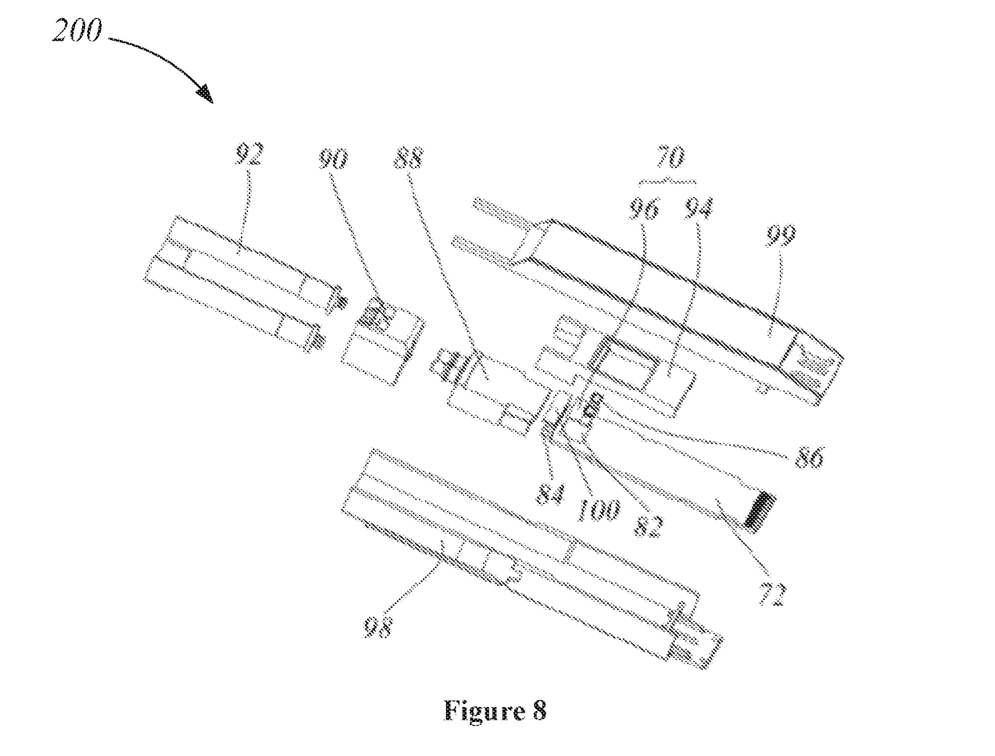
FIG. 8 is an exploded-view diagram showing an optical module in a second embodiment of the present disclosure.

FIGS. 7 through 12 schematically illustrate an optical module 200 consistent with a second exemplary embodiment of the disclosure. FIG. 7 is a three-dimensional diagram of the optical module 200 in the second embodiment. FIG. 8 is an exploded-view diagram of the optical module 200 in the second embodiment. Referring to FIGS. 7 and 8, the optical module 200 includes a housing 68, an optical interface system 88 arranged in housing 68, a connector 90 into which the optical interface system 88 is plugged, and a pull ring 92 that is arranged on the housing 68 and used to unlock the optical module. Additionally, the optical module further includes a heat sink apparatus 70 and a printed circuit board 72. Here, the heat sink apparatus 70 is arranged in the housing 68 and is thermally connected to the housing 68, and the printed circuit board 72 is also arranged in the housing 68. Similar to the first exemplary embodiment, in the second exemplary embodiment, the printed circuit board 72 is fixed to the housing 68 by snap-fitting, and the heat sink apparatus 70 is fixed with an adhesive to the housing 68. The printed circuit board 72 may be arranged in the housing 68 by other connecting methods; similarly, the heat sink apparatus 70 may be arranged in the housing 68 by other connecting methods as well.

Figure 9:
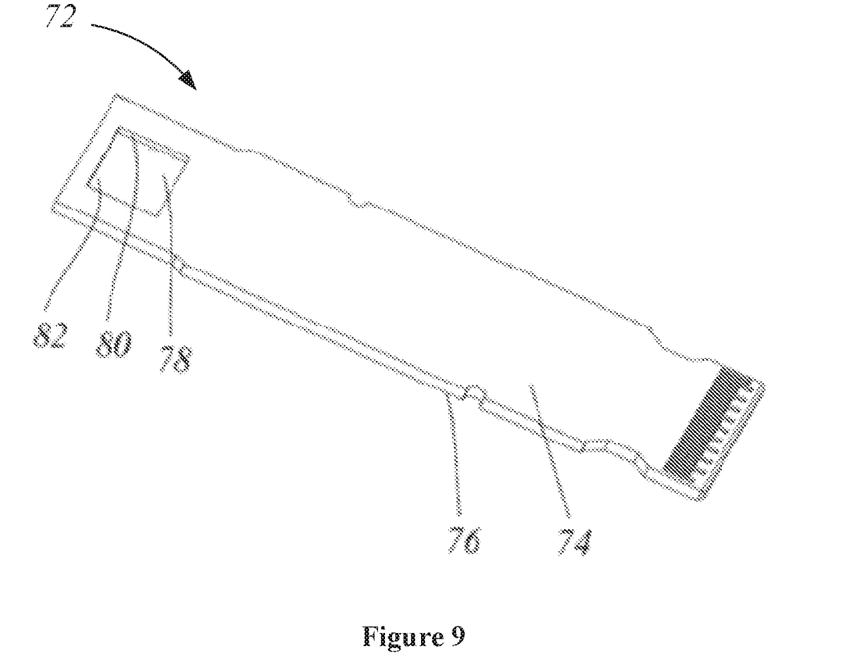
FIG. 9 is a three-dimensional diagram showing the printed circuit board of the optical module in FIG. 8.
Figure 10:
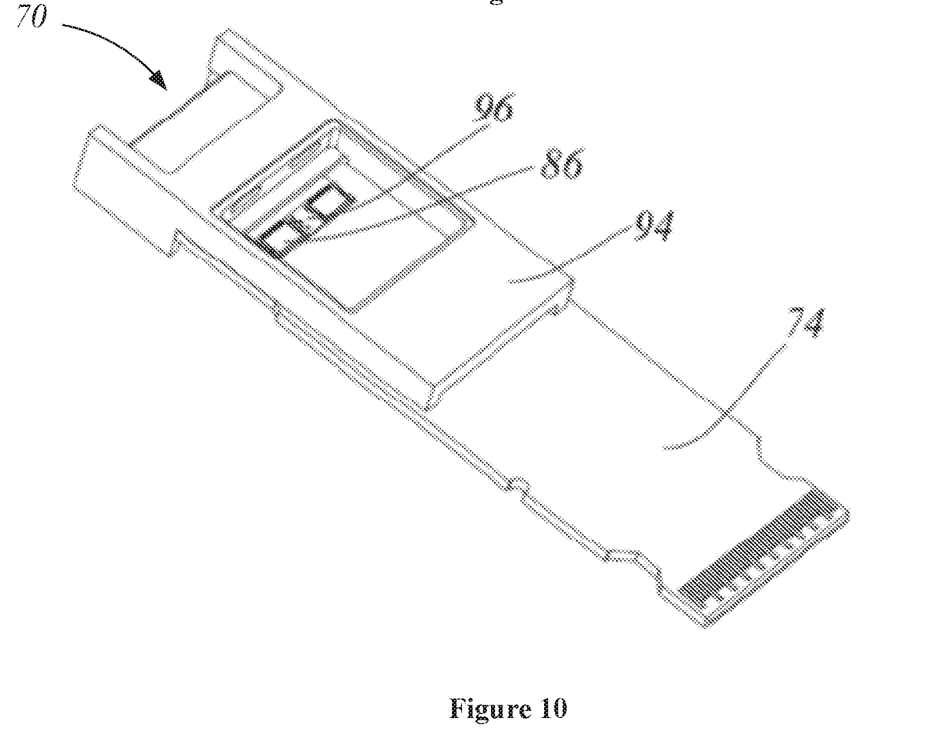
FIG. 10 is a three-dimensional diagram showing the printed circuit board, heat sink apparatus, and optoelectronic chip area of an optical module in the second embodiment of the present disclosure.
Figure 11:
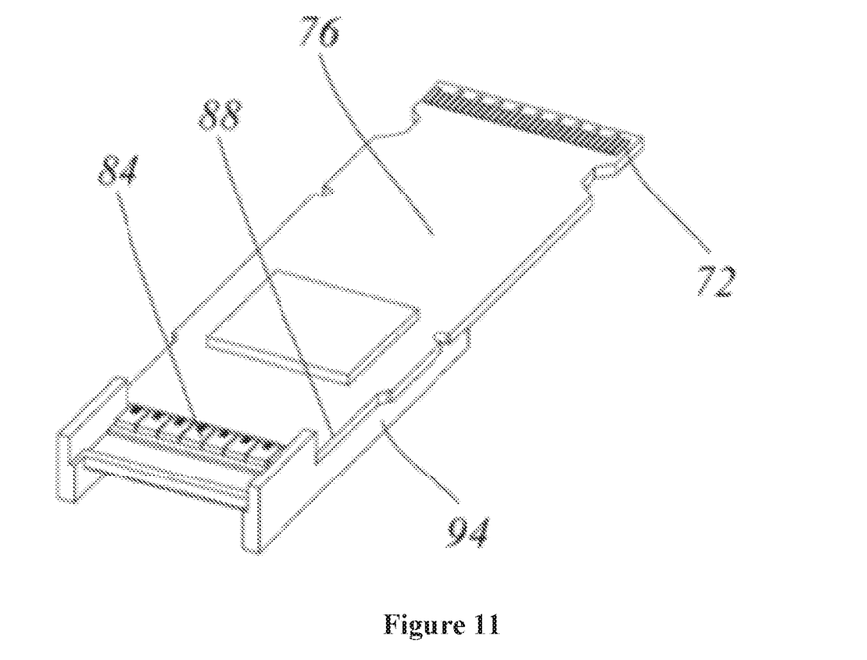
FIG. 11 is a three-dimensional diagram showing the optical module in FIG. 10 from a different perspective.
Figure 12:
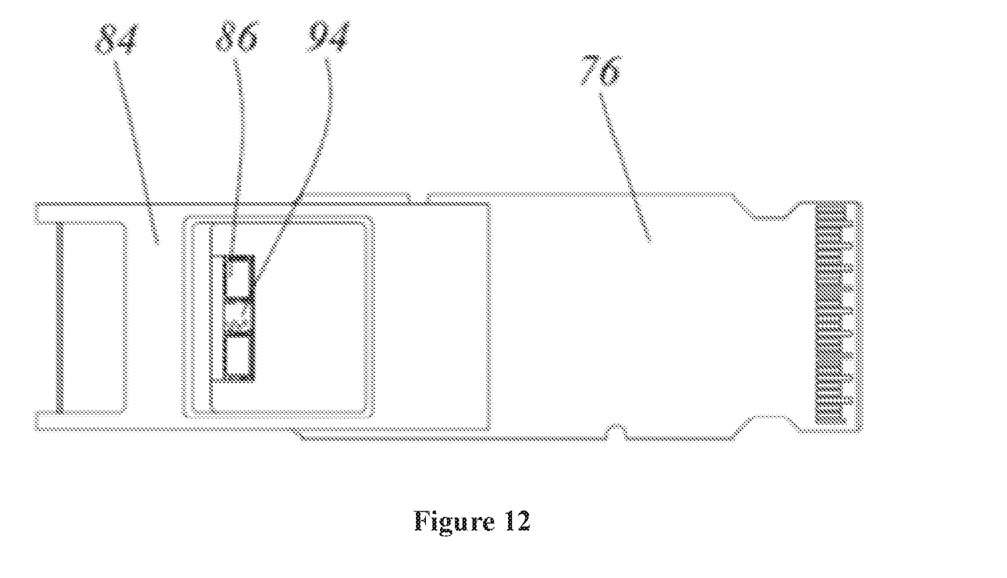
FIG. 12 is a front view of the optical module in FIG. 10.

FIG. 9 is a three-dimensional diagram of the printed circuit board 72 of the optical module 200 in FIG. 8. FIG. 10 is a three-dimensional diagram showing the printed circuit board 72, the heat sink apparatus 70, and optoelectronic chip area of the optical module 200 in the second exemplary embodiment. FIG. 11 is a three-dimensional diagram of the optical module 200 in FIG. 10 from a different perspective. FIG. 12 is a front view of the optical module 200 in FIG. 10. Referring to FIGS. 9 through 12, the printed circuit board 72 has a first surface 74, a second surface 76, and an accommodating space 82 located on the first surface 74. Here, the first surface 74 and the second surface 76 are opposite to each other. Specifically, the printed circuit board 72 further includes a third surface 78 and a side surface 80 that connects the first surface 74 and the third surface 78. The third surface 78 is located between the first surface 74 and the second surface 76 and has a certain height difference from the first surface 74. The third surface 78 and the side surface 80 form the accommodating space 82, and the heat sink apparatus 70 is partially located in the accommodating space 82. Specifically, the accommodating space 82 is an accommodating recess. The optical module 200 further includes a first optoelectronic chip 84 and a second optoelectronic chip 86 that are both arranged on the heat sink apparatus 70 and both electrically connected with the printed circuit board 72. Additionally, at least a portion of the second optoelectronic chip 86 is located in the accommodating space 82, and the second optoelectronic chip 86 and the first optoelectronic chip 84 are arranged separately from each other.

In the second exemplary embodiment, because the printed circuit board 72 has the accommodating space 82 formed by the third surface 78 and the side surface 80, the heat sink apparatus 70 is partially located in the accommodating space 82, at least a portion of the second optoelectronic chip 86 is located in the accommodating space 82, and the heat sink apparatus 70 is located in between the second optoelectronic chip 86 and the printed circuit board 72, so that heat generated by the first optoelectronic chip 84 and the second optoelectronic chip 86 is dissipated to the housing 68 through the heat sink apparatus 70, resulting in a high heat-dissipation capability. Concurrently, the second optoelectronic chip 86 is separated from the first optoelectronic chip 84, thereby increasing the distance between the two optoelectronic chips, which greatly reduces the impact of signal crosstalk between the first optoelectronic chip 84 and the second optoelectronic chip 86 and also improves heat dissipation performance.

The heat sink apparatus 70 includes a first heat sink 94 and a second heat sink 96 that is thermally connected to the first heat sink 94. The first optoelectronic chip 84 is arranged on the first heat sink 94. At least a portion of the second heat sink 96 is located in the accommodating space 82, and the second optoelectronic chip 86 is thermally connected to the second heat sink 96. In this way, heat generated by the first optoelectronic chip 84 and the second optoelectronic chip 86 is caused to dissipate to the housing 68 through the first heat sink 94 and the second heat sink 96, respectively. The distance between the first optoelectronic chip 84 and the second optoelectronic chip 86 ensures a comparatively high heat-dissipation capability while further reducing the impact of signal crosstalk between the first optoelectronic chip 84 and the second optoelectronic chip 86.

In this example embodiment, the first heat sink 94 and the second heat sink 96 are separately arranged, and the second heat sink 96 is fixed with an adhesive and thermally connected to the first heat sink 94. The first heat sink 94 and the second heat sink 96 may also form an integrated single structure.

The housing 68 includes a first housing 98 and a second housing 99 that is connected to the first housing 98, and the heat sink apparatus 70 is arranged near the second housing 99. Therefore, heat generated by the first optoelectronic chip 84 and the second optoelectronic chip 86 primarily transfers to the second housing 99, and the second housing 99 constitutes a primary heat-dissipation surface. Additionally, only a portion of the heat transfers to the first housing 98. Therefore, the first housing 98 constitutes a secondary heat-dissipation surface.

In order to further increase the heat-dissipation capability of the optical module 200, a thermal pad (not illustrated) or thermal grease may also be arranged between the heat sink apparatus 70 and the housing 68 so as to better conduct the heat from the heat sink apparatus 70 to the housing 68.

In this example embodiment, the cross section of the accommodating space 82 in the direction parallel to the first surface 74 is a closed shape. In other words, the accommodating space 82 is a recess arranged on the printed circuit board 72, and the accommodating space 82 does not penetrate all the way through and has a periphery that forms a closed shape. Preferably, the cross section of the accommodating space 82 in the direction parallel to the first surface 74 is square. The cross section of the accommodating space 82 in the direction parallel to the first surface 74 may be configured to be other closed shapes.

Additionally, the cross section of the accommodating space 82 in the direction parallel to the first surface 74 may also be configured to be an open shape. For example, the cross section of the accommodating space 82 in the direction parallel to the first surface 74 may be configured to be U-shaped or L-shaped. Correspondingly, there would be two or three side surfaces 80. The accommodating space 82 may also be configured to be other open shapes.

In the second exemplary embodiment, the first optoelectronic chip 84 is a transmitting-end chipset, and the second optoelectronic chip 86 is a receiving-end chipset. The first optoelectronic chip 84 may also be configured to be a receiving-end chipset and the second optoelectronic chip 86 to be a transmitting-end chipset. Alternatively, the first optoelectronic chip 84 and the second optoelectronic chip 86 may both be configured to be transmitting-end chipsets, or the first optoelectronic chip 84 and the second optoelectronic chip 86 may both be configured to be receiving-end chipsets.

The printed circuit board 72 is adhered on heat sink apparatus 70. Other connecting methods may be used to connect the printed circuit board 72 on the heat sink apparatus 70. In the second exemplary embodiment, the first optoelectronic chip 84 and the second optoelectronic chip 86 are located on different sides of the heat sink apparatus 70. Specifically, the first optoelectronic chip 84 and the second optoelectronic chip 86 are arranged on opposite sides of the heat sink apparatus 70. The first optoelectronic chip 84 and the second optoelectronic chip 86 may also be arranged on the same side of the heat sink apparatus 70. Specifically, when the first optoelectronic chip 84 and the second optoelectronic chip 86 are located on different sides of the heat sink apparatus 70, a hole or groove is arranged on the first heat sink 94 to allow light to pass through. An optical fiber may also be used to realize the connection of the optical path.

Additionally, a first electrical isolation pad 100 is arranged between the first optoelectronic chip 84 and the heat sink apparatus 70. The first electrical isolation pad 100 is thermally connected to and electrically isolated from the heat sink apparatus 70, thereby enabling heat generated from the first optoelectronic chip 84 to transfer to the housing 68 through the heat sink apparatus 70 to realize heat dissipation while achieving electrical isolation between the housing 68, the heat sink apparatus 70, and the first optoelectronic chip 84. This stabilizes the performance of the optical module and makes it safe to use.

A second electrical isolation pad (not illustrated) is arranged between the second optoelectronic chip 86 and the heat sink apparatus 70, and the second electrical isolation pad is thermally connected to and electrically isolated from the heat sink apparatus 70. Similarly, heat generated from the second optoelectronic chip 86 may transfer to the housing 68 through the heat sink apparatus 70 to realize heat dissipation while achieving electrical isolation between the housing 68, the heat sink apparatus 70, and the second optoelectronic chip 86. This further stabilizes the performance of the optical module and makes it safer to use.

Specifically, the first electrical isolation pad 100 is arranged between the first optoelectronic chip 84 and the first heat sink 94, and the second electrical isolation pad is arranged between the second optoelectronic chip 86 and the second heat sink 96.

Figure 13:
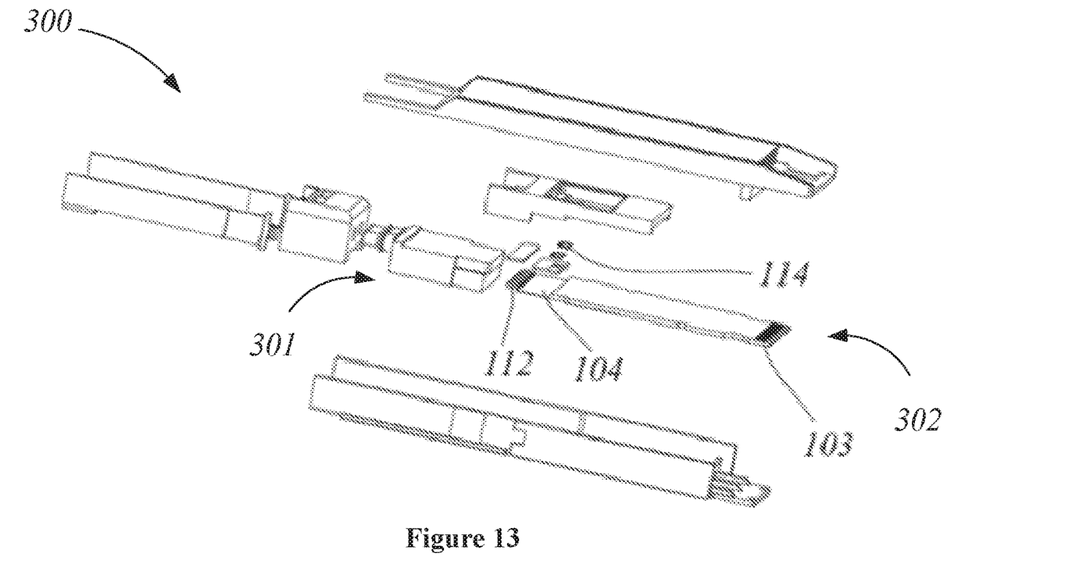
FIG. 13 is an exploded-view diagram showing an optical module in the third embodiment of the present disclosure.
Figure 14:
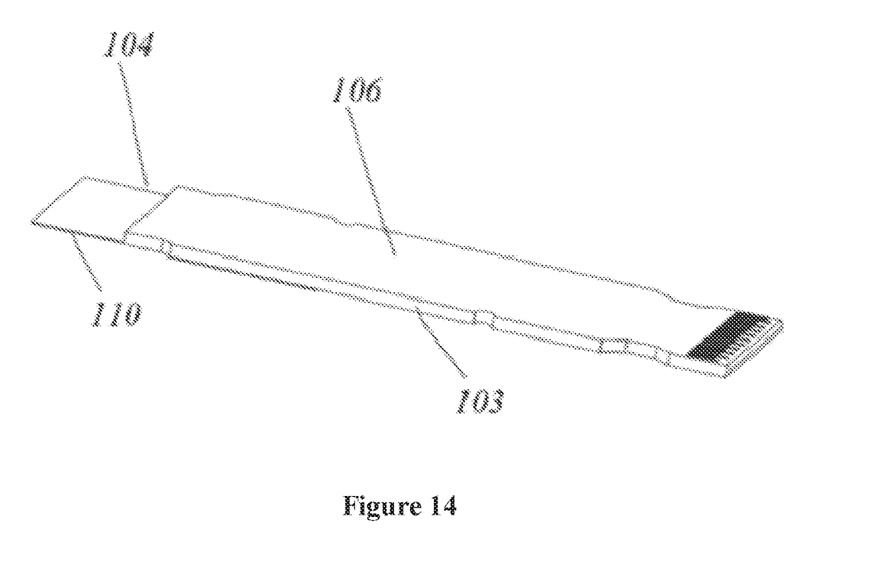
FIG. 14 is a three-dimensional diagram showing the printed circuit board of the optical module in FIG. 13.

FIGS. 13 and 14 schematically illustrate an optical module 300 consistent with a third exemplary embodiment of the disclosure. FIG. 13 is an exploded-view diagram of the optical module 300 in the third embodiment of the present disclosure. FIG. 14 is a three-dimensional diagram of a printed circuit board of the optical module 300 in FIG. 13. Referring to FIGS. 13 and 14, in the third exemplary embodiment provided by the present disclosure, a printed circuit board 103 and an accommodating space 104 are constructed differently from those in the second exemplary embodiment, and the third example embodiment is otherwise identical to the second embodiment. The differences are described in detail below while the similarities will not be described again in detail.

In the third exemplary embodiment, the cross section of the accommodating space 104 in the direction parallel to the first surface 106 is an open shape. Specifically, the cross section of the accommodating space 104 in the direction parallel to a first surface 106 of the printed circuit board 103 is configured to be a straight line. Correspondingly, there is a single side surface. In other words, the printed circuit board 103 has a step that forms the accommodating space 104.

The optical module 300 includes an optical interface 301 and an electrical interface 302. An end of the printed circuit board 103 nearest to the optical interface 301 forms a step circuit board 110, and a step portion of the step circuit board 110 forms the accommodating space 104 that accommodates a second optoelectronic chip 114. The step circuit board 110 may be a rigid circuit board or a flexible circuit board. In other words, the end of the printed circuit board 103 nearest to the optical interface 301 may connect to a flexible circuit board, and the flexible circuit board and the end of the printed circuit board 103 form the accommodating space 104 that accommodates the second optoelectronic chip 114.

In the third exemplary embodiment, the first optoelectronic chip 112 is disposed near the printed circuit board 103 and is electrically connected to the printed circuit board 103, and the second optoelectronic chip 114 is disposed near the step circuit board 110 and is electrically connected to the step circuit board 110. The configuration may also be that the first optoelectronic chip 112 is disposed near the step circuit board 110 and is electrically connected to the step circuit board 110 while, correspondingly, the second optoelectronic chip 114 is disposed near the printed circuit board 103 and is electrically connected to the printed circuit board 103.

Similarly, the first optoelectronic chip 112 is a transmitting-end chipset, and the second optoelectronic chip 114 is a receiving-end chipset. The first optoelectronic chip 112 may also be configured to be a receiving-end chipset and the second optoelectronic chip 114 to be a transmitting-end chipset. Or, the first optoelectronic chip 112 and the second optoelectronic chip 114 may both be configured to be transmitting-end chipsets, or the first optoelectronic chip 112 and the second optoelectronic chip 114 may both be configured to be receiving-end chipsets.

Compared to currently available technology, the embodiments of the present disclosure provide the following benefits. In the technical solution provided by the present disclosure, an opening is arranged on a printed circuit board, a second optoelectronic chip is arranged in the opening, and a first optoelectronic chip and the second optoelectronic chip are both arranged on a heat sink apparatus. Therefore, heat generated by the first optoelectronic chip and the second optoelectronic chip is dissipated to a housing through the heat sink apparatus, resulting in a high heat-dissipation capability. Concurrently, the second optoelectronic chip is separated from the first optoelectronic chip, thereby increasing the distance between the two optoelectronic chips, which greatly reduces the impact of signal crosstalk between the first optoelectronic chip and the second optoelectronic chip.

It should be understood that despite the descriptions of embodiments in the specification, each embodiment does not entail only one single independent technical solution. The specification is written this way simply for the sake of clarity. Those skilled in the art should treat the specification as a whole. The technical solutions associated with the embodiments may be combined in appropriate ways to form other embodiments that can be understood by persons of skill in the art.

The series of detailed descriptions above is only intended to provide specific descriptions of feasible embodiments of the present disclosure. The detailed descriptions are not to be construed as limiting the scope of protection for the present disclosure; all equivalent embodiments or changes that are not detached from the techniques of the present disclosure in essence should fall under the scope of protection of the present disclosure.

What is claimed is:

1. An optical module, comprising:
a housing;
a heat sink apparatus arranged in and thermally connected to the housing; and
a printed circuit board partially arranged in the heat sink apparatus,
wherein
the optical module further comprises a first optoelectronic chip and a second optoelectronic chip that are both arranged on the heat sink apparatus,
the first optoelectronic chip and second optoelectronic chip are both electrically connected to the printed circuit board,
the printed circuit board has a first surface, a second surface opposite to the first surface, and an opening that extends from the first surface to the second surface,
the second optoelectronic chip is arranged at the opening,
the second optoelectronic chip is arranged separately from the first optoelectronic chip,
the printed circuit board has an external electrical interface, for realizing external electrical connections, arranged at an end of the printed circuit board, the external electrical interface including gold fingers,
the heat sink apparatus has an L-shape and comprises a first heat sink corresponding to a first side of the L-shape and a second heat sink corresponding to a second side of the L-shape,
the first optoelectronic chip is arranged on the first heat sink, and
the second optoelectronic chip is arranged on the second heat sink, and
the L-shape heat sink apparatus extends parallel to a surface of the printed circuit board.

2. The optical module according to claim 1, wherein
at least a portion of the second heat sink is located in the opening, and
the second optoelectronic chip is arranged on the portion of the second heat sink.

3. The optical module according to claim 2, wherein the first heat sink and second heat sink form an integrated single structure.

4. The optical module according to claim 1, wherein
the optical module comprises an optical interface and an electrical interface, and
the first optoelectronic chip is located at an end of the printed circuit board nearest to the optical interface.

5. The optical module according to claim 4, wherein positions of the first optoelectronic chip and the second optoelectronic chip are staggered along a direction of a line connecting the optical interface and the electrical interface.

6. The optical module according to claim 4, wherein the heat sink apparatus and the housing form an integrated single structure.

7. The optical module according to claim 1,
wherein the housing includes a first housing and a second housing facing each other and connected to each other,
the heat sink apparatus being arranged between the first housing and the second housing and thermally connected to the second housing,
the first heat sink has a base and a first protruding platform protruding towards the first housing,
the first optoelectronic chip is arranged on the first protruding platform,
the second heat sink has a second protruding platform, and
the second protruding platform is partially located in the opening.

8. The optical module according to claim 1, wherein the first optoelectronic chip is a transmitting-end chipset, and the second optoelectronic chip is a receiving-end chipset.

9. The optical module according to claim 1, wherein a cross section of the opening in a direction parallel to the first surface is a closed shape or an open shape.

10. The optical module according to claim 1, wherein the printed circuit board is adhered on the heat sink apparatus.

11. The optical module according to claim 1, wherein the first optoelectronic chip and second optoelectronic chip are located on the same side or different sides of the heat sink apparatus.

12. The optical module of claim 1, wherein the housing includes a first housing and a second housing connected to the first housing,
the heat sink apparatus being arranged between the first housing and the second housing and thermally connected to the second housing.

13. The optical module of claim 1, wherein the first optoelectronic chip and the second optoelectronic chip are staggered in a transmission direction of an optical path of the optical module.

14. An optical module, comprising:
a housing;
a heat sink apparatus arranged in and thermally connected to the housing; and
a printed circuit board partially arranged in the heat sink apparatus,
wherein
the optical module further comprises a first optoelectronic chip and a second optoelectronic chip, the first optoelectronic chip being arranged on the heat sink apparatus,
the first optoelectronic chip and second optoelectronic chip are both electrically connected to the printed circuit board,
the second optoelectronic chip is arranged separately from the first optoelectronic chip,
the printed circuit board has an external electrical interface, for realizing external electrical connections, arranged at an end of the printed circuit board, the external electrical interface including gold fingers, and
the heat sink apparatus has a hole or a groove to allow light to pass through.

15. The optical module according to claim 14, wherein
the optical module includes an optical interface and an electrical interface,
an end of the printed circuit board nearest to the optical interface forms a flexible circuit board, and
the flexible circuit board and the end of the printed circuit board form the accommodating space that accommodates the second optoelectronic chip.

16. The optical module according to claim 14, wherein
the optical module includes an optical interface and an electrical interface,
an end of the printed circuit board nearest to the optical interface forms a step circuit board, and
a step portion of the step circuit board forms the accommodating space that accommodates the second optoelectronic chip.

17. The optical module of claim 14, wherein the housing includes a first housing and a second housing connected to the first housing, the heat sink apparatus being arranged between the first housing and the second housing and thermally connected to the second housing.

18. An optical module, comprising:

a housing including a first housing and a second housing facing each other and connected to each other;

a heat sink apparatus arranged between the first housing and the second housing and thermally connected to the second housing; and a printed circuit board partially arranged in the heat sink apparatus, wherein the optical module further comprises a first optoelectronic chip and a second optoelectronic chip, the first optoelectronic chip being arranged on the heat sink apparatus, the first optoelectronic chip and second optoelectronic chip are both electrically connected to the printed circuit board, the second optoelectronic chip is arranged separately from the first optoelectronic chip, the first optoelectronic chip is arranged on a side of the printed circuit board near an end of the printed circuit board opposite to an end at which an external electrical interface is arranged for realizing external electrical connections, the printed circuit board has a first surface, a second surface opposite to the first surface, a third surface located between the first surface and the second surface and parallel to the first surface and the second surface, and a side surface connecting the first surface and the third surface, the printed circuit board includes an accommodating recess formed by the side surface and the third surface, and the accommodating recess accommodates the second optoelectronic chip.

* * * * *

UNITED STATES PATENT AND TRADEMARK OFFICE
CERTIFICATE OF CORRECTION

PATENT NO. : 10,791,620 B2
APPLICATION NO. : 16/021087
DATED : September 29, 2020
INVENTOR(S) : Long Chen et al.

Page 1 of 1

It is certified that error appears in the above-identified patent and that said Letters Patent is hereby corrected as shown below:

On the Title Page

Item (30), under "Foreign Application Priority Data," "2017 1 0591780" should read
-- 201710591780.5 --.

Signed and Sealed this
Nineteenth Day of January, 2021

Andrei Iancu
*Director of the United States Patent and Trademark Office*